(12) United States Patent
Yoshino et al.

(10) Patent No.: US 8,035,979 B2
(45) Date of Patent: Oct. 11, 2011

(54) PRINTED WIRING BOARD WITH BUILT-IN SEMICONDUCTOR ELEMENT, AND PROCESS FOR PRODUCING THE SAME

(75) Inventors: Yutaka Yoshino, Isesaki (JP); Takahiro Shirai, Isesaki (JP); Shinji Kadono, Isesaki (JP); Mineo Kawamoto, Kitakanbara-gun (JP); Minoru Enomoto, Shinjuku-ku (JP); Masakatsu Goto, Shinjuku-ku (JP); Makoto Araki, Shinjuku-ku (JP); Naoki Toda, Shinjuku-ku (JP)

(73) Assignees: CMK Corporation, Tokyo (JP); Renesas Eastern Japan Semiconductor, Inc., Tokyo (JP)

( * ) Notice: Subject to any disclaimer, the term of this patent is extended or adjusted under 35 U.S.C. 154(b) by 0 days.

(21) Appl. No.: 12/966,251

(22) Filed: Dec. 13, 2010

(65) Prior Publication Data

US 2011/0090657 A1    Apr. 21, 2011

Related U.S. Application Data

(62) Division of application No. 11/913,559, filed as application No. PCT/JP2005/323699 on Nov. 28, 2006, now Pat. No. 7,894,200.

(30) Foreign Application Priority Data

Jan. 13, 2006  (JP) .................................. 2006-005582
Oct. 16, 2006  (JP) .................................. 2006-280930

(51) Int. Cl.
*H05K 1/18* (2006.01)

(52) U.S. Cl. ........ 361/761; 361/762; 361/783; 361/768; 361/771

(58) Field of Classification Search .................. 361/783, 361/771, 760–768, 790, 795, 808, 811, 746, 361/820, 750, 739, 751, 757; 174/260, 256, 174/259, 50.5, 564, 261–266, 255; 257/E23.062, 257/E23.077, E23.126, E21.502, E21.503, 257/787–795
See application file for complete search history.

(56) References Cited

U.S. PATENT DOCUMENTS 7,307,852 B2    12/2007 Inagaki et al.
(Continued)

FOREIGN PATENT DOCUMENTS

JP    2001-044641    2/2001
(Continued)

OTHER PUBLICATIONS

Korean Office Action issued on Feb. 7, 2011, in the corresponding Korean Patent Application No. 10-2007-7028717.

*Primary Examiner* — Hoa C Nguyen
(74) *Attorney, Agent, or Firm* — Oblon, Spivak, McClelland, Maier & Neustadt, L.L.P.

(57) ABSTRACT

A printed wiring board includes a built-in semiconductor element. A protective film is formed on a semiconductor element-mounted surface of a base substrate to which the built-in semiconductor element is connected to protect the semiconductor element-mounted surface excepting a mounting pad. Upper and side surfaces of the built-in semiconductor element are covered with a first insulating film formed by filling a sealing material. The first insulating film is covered with a second insulating film formed of an insulating resin melted from an insulating layer that is provided in side and upper portions of the built-in semiconductor element.

7 Claims, 11 Drawing Sheets

U.S. PATENT DOCUMENTS

| | | |
|---|---|---|
| 7,435,910 B2 | 10/2008 | Sakamoto et al. |
| 2002/0159243 A1* | 10/2002 | Ogawa et al. ................. 361/760 |
| 2003/0090883 A1 | 5/2003 | Asahi et al. |
| 2003/0150641 A1 | 8/2003 | Kinayman et al. |
| 2003/0183920 A1 | 10/2003 | Goodrich et al. |
| 2004/0014317 A1* | 1/2004 | Sakamoto et al. ............ 438/689 |
| 2005/0157478 A1 | 7/2005 | Inagaki et al. |
| 2006/0003495 A1 | 1/2006 | Sunohara et al. |
| 2006/0087020 A1 | 4/2006 | Hirano et al. |
| 2006/0138591 A1* | 6/2006 | Amey et al. ................... 257/532 |

FOREIGN PATENT DOCUMENTS

| | | |
|---|---|---|
| JP | 2002-344146 | 11/2002 |
| JP | 2005-039094 | 2/2005 |
| KR | 10-0488412 | 5/2005 |

* cited by examiner

Fig. 6
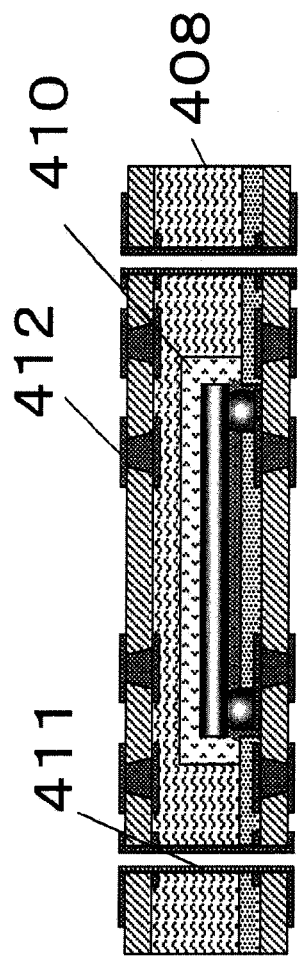
(g)
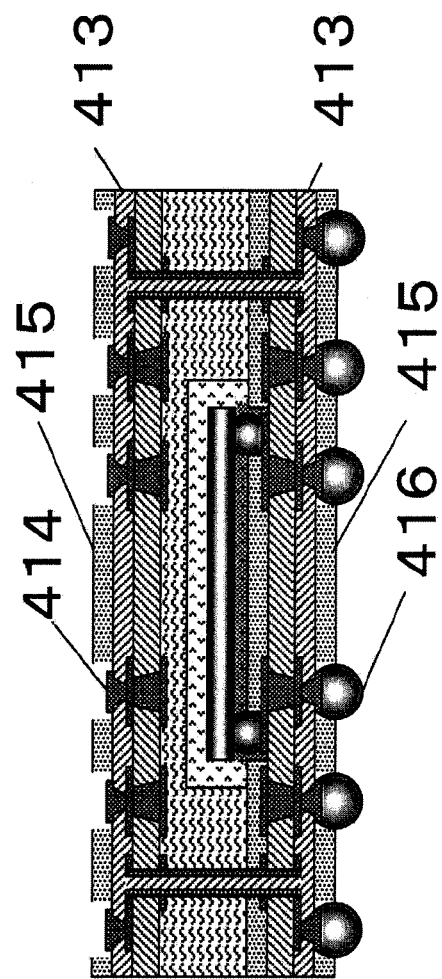
(h)

Fig. 11
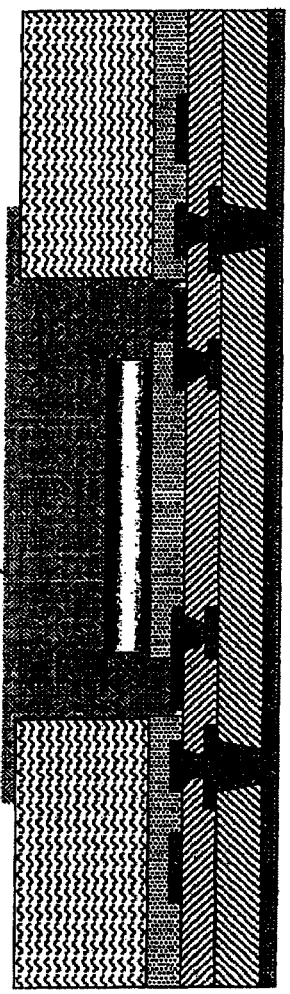
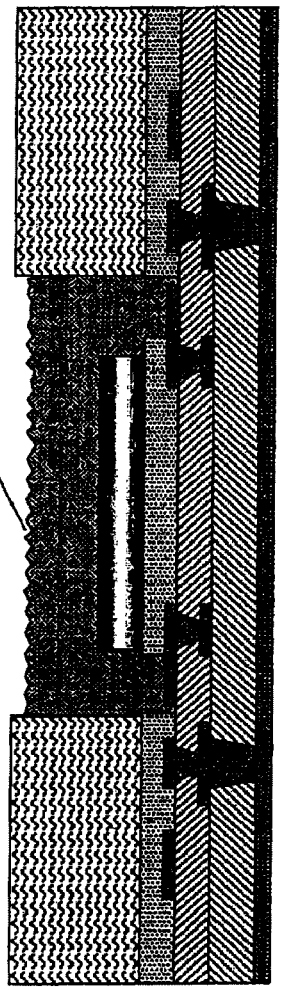
Fig. 11
Background Art

PRINTED WIRING BOARD WITH BUILT-IN SEMICONDUCTOR ELEMENT, AND PROCESS FOR PRODUCING THE SAME

CROSS-REFERENCE TO RELATED APPLICATIONS

The present application is a divisional of and claims the benefit of priority under 35 U.S.C. §120 from U.S. Ser. No. 11/913,559, filed on Nov. 5, 2007, the entire content of which is incorporated herein by reference. U.S. Ser. No. 11/913,559 is the national stage of PCT/JP06/323699, filed Nov. 28, 2006, and claims the benefit of priority under 35 U.S.C. §119 from Japanese Patent Application Nos. 2006-005582, filed Jan. 13, 2006, and 2006-280930, filed Oct. 16, 2006.

TECHNICAL FIELD

The present invention relates to a printed wiring board with a built-in semiconductor element covered with an insulating film and a process for producing the same.

BACKGROUND ART

As more compact, thinner mobile devices with more functions have been developed, the overall thicknesses of such devices are required to be thinner. A solution that has been proposed to meet the demand is a printed wiring board with a built-in semiconductor element.

In a conventional printed wiring board with a built-in semiconductor element, a wiring circuit is formed also on a sealing material to achieve high-density wiring (see Patent Document 1, for example).

Another conventional printed wiring board with a built-in semiconductor element is produced by counterboring a substrate (an organic substrate is typically used) to form a recess, mounting a semiconductor element in the recess, connecting the semiconductor element to the substrate through wire bonding, sealing the semiconductor element with a sealing material and forming a wiring layer in an overlying layer (see Patent Document 2, for example).

[Patent Document 1]: Japanese Patent Application Laid-Open Publication No. 9-46046

[Patent Document 2]: Japanese Patent Application Laid-Open Publication No. 2001-15926

However, the conventional printed wiring boards with built-in semiconductor elements have the following problems.

A first problem of the conventional printed wiring boards with built-in semiconductor elements described above will be first described with reference to FIG. 9(A). A printed wiring board 600 with a built-in semiconductor element shown in FIG. 9(A) has a configuration in which a semiconductor element 602 is connected to a base substrate 601 through wire bonding 603 and the semiconductor element 602 including the wire bonding 603 is then sealed with a sealing material 604. The sealing material 604, however, contains a large amount of inorganic fillers and a small amount of resin to balance the linear expansion coefficient of the semiconductor element 602 with those of side and overlying wiring layers 605, which are organic substrates. The sealing material 604 having such composition likely produces excessive roughness only on its surface in a desmear treatment for circuit formation. This disadvantageously reduces adhesion between the wiring circuit and the sealing material 604 when subjected to thermal history in backend production steps, often resulting in delamination. FIG. 9(B) is a cross-sectional view showing such a delaminated wiring circuit 606.

A second conventional problem in a printed wiring board 700 with an embedded semiconductor element 701 shown in FIG. 10(A) will be described. The printed wiring board 700 with a built-in semiconductor element has a configuration in which the semiconductor element 701 is mounted in a counterbored recess in an insulating substrate and connected through wire bonding 702 and the semiconductor element 701 including the wire bonding 702 is sealed with epoxy resin, which is a sealing material 703.

However, if the adjusted amount of the filled sealing material 703 is insufficient, a gap 704 will be created between the sealing material 703 and an overlying wiring layer. The gap 704 will expand due to the heat generated in a reflow process or the like when surface mounting components are mounted, disadvantageously resulting in cracking or delamination 705 of the overlying wiring board as shown in FIG. 10(B).

In addition, a third conventional problem will be described with reference to FIG. 11(A). A printed wiring board 800 with a built-in semiconductor element shown in FIG. 11(A) has a configuration in which a semiconductor element including wire bonding is sealed with a sealing material 801. However, when the amount of the filled sealing material 801 is excessive, the sealing material 801 overflows on the upper surface of a side wiring board, disadvantageously resulting in a situation where an extra polishing step is required.

In addition to the extra polishing step, since the material of the sealer differs from that of the side wiring board, it is difficult to perform polishing uniformly. Therefore, the surface of the sealing material 801 likely has irregularities 802 in a disadvantageous manner, as shown in FIG. 11(B).

If the surface filled with the sealing material 801 cannot be polished uniformly, the irregularities also affect an overlying wiring layer, so that it is difficult to form a flat overlying wiring layer. That is, the overlying wiring layer affected by the irregularities makes it difficult to form a wiring circuit with a narrow linewidth (50 µm or smaller, in particular).

Furthermore, since the sealing material 801 contains a large amount of filling material, such as inorganic fillers, there is a problem of poor adhesion to the overlying wiring board.

When the recess in which the semiconductor element is mounted is entirely covered with the sealing material 801, as mentioned above, the fact that the sealing resin contains a large amount of inorganic fillers and a small amount of resin causes a problem of deformed shapes of holes in a desmear treatment, which is carried out after the step of drilling through holes, vias and the like for interlayer connection.

The present invention has been made in view of such conventional problems described above and aims to provide a printed wiring board with a built-in semiconductor element in which a semiconductor element is built in the printed wiring board and a sealing material covers the semiconductor element to protect it from moisture absorption. The printed wiring board is characterized in that an insufficient amount of the filled sealing material does not suffer from the gap problem and an excessive amount of the filling material does not require polishing or the like in backend steps, thus exhibiting excellent adhesion to an overlying wiring board. The present invention also provides a process for producing such a printed wiring board with a built-in semiconductor element.

DISCLOSURE OF THE INVENTION

The present invention solves the above problems by providing a printed wiring board with a built-in semiconductor element, the printed wiring board comprising a built-in semiconductor element and characterized in that at least the lower surface, the upper surface, or the side surface of the semiconductor element is covered with an insulating film, and an insulating layer is provided in the side and upper portions of the semiconductor element.

The present invention solves the above problems by providing a process for producing a printed wiring board with a built-in semiconductor element characterized in that the process comprises the steps of mounting a semiconductor element on a base substrate and covering at least the lower surface, the upper surface, or the side surface of the semiconductor element with an insulating film, disposing and stacking a semicured insulating sheet in the side portion of the semiconductor element, and disposing and stacking a semicured insulating sheet in the upper portion of the semiconductor element.

The present invention solves the above problems by providing a process for producing a printed wiring board with a built-in semiconductor element characterized in that the process comprises the steps of mounting a semiconductor element on a base substrate and covering the lower surface or the upper surface of the semiconductor element with a first insulating film, disposing a semicured insulating sheet in the side portion of the semiconductor element, disposing a semicured insulating sheet in the upper portion of the semiconductor element, and simultaneously stacking the side and upper semicured sheets to cover the side surface and/or the upper surface of the semiconductor element with a second insulating layer.

According to the present invention, since the mounted semiconductor element is covered with at least the first insulating film, it is possible to balance the linear expansion coefficient of the organic substrate with that of the semiconductor element. Furthermore, the presence of the second insulating film can protect the semiconductor element from moisture absorption. As a result, the adhesion to the overlying wiring board can be improved.

Moreover, in the present invention, by using the semicured insulating sheet and filling the gap around the semiconductor element with the second insulating film, it is possible to form an interlayer connection via located close to the first insulating film.

It is also possible to solve the problem of insufficient or excessive amount of the filled sealing material.

BRIEF DESCRIPTION OF THE DRAWINGS

FIGS. 6(g) and 6(h) are schematic explanatory cross-sectional views of production steps following FIGS. 5(a) to 5(f);

FIGS. 11(A) and 11(B) are schematic explanatory cross-sectional views showing still another conventional printed wiring board with a built-in semiconductor element.

DESCRIPTION OF THE SYMBOLS

Figure 1:
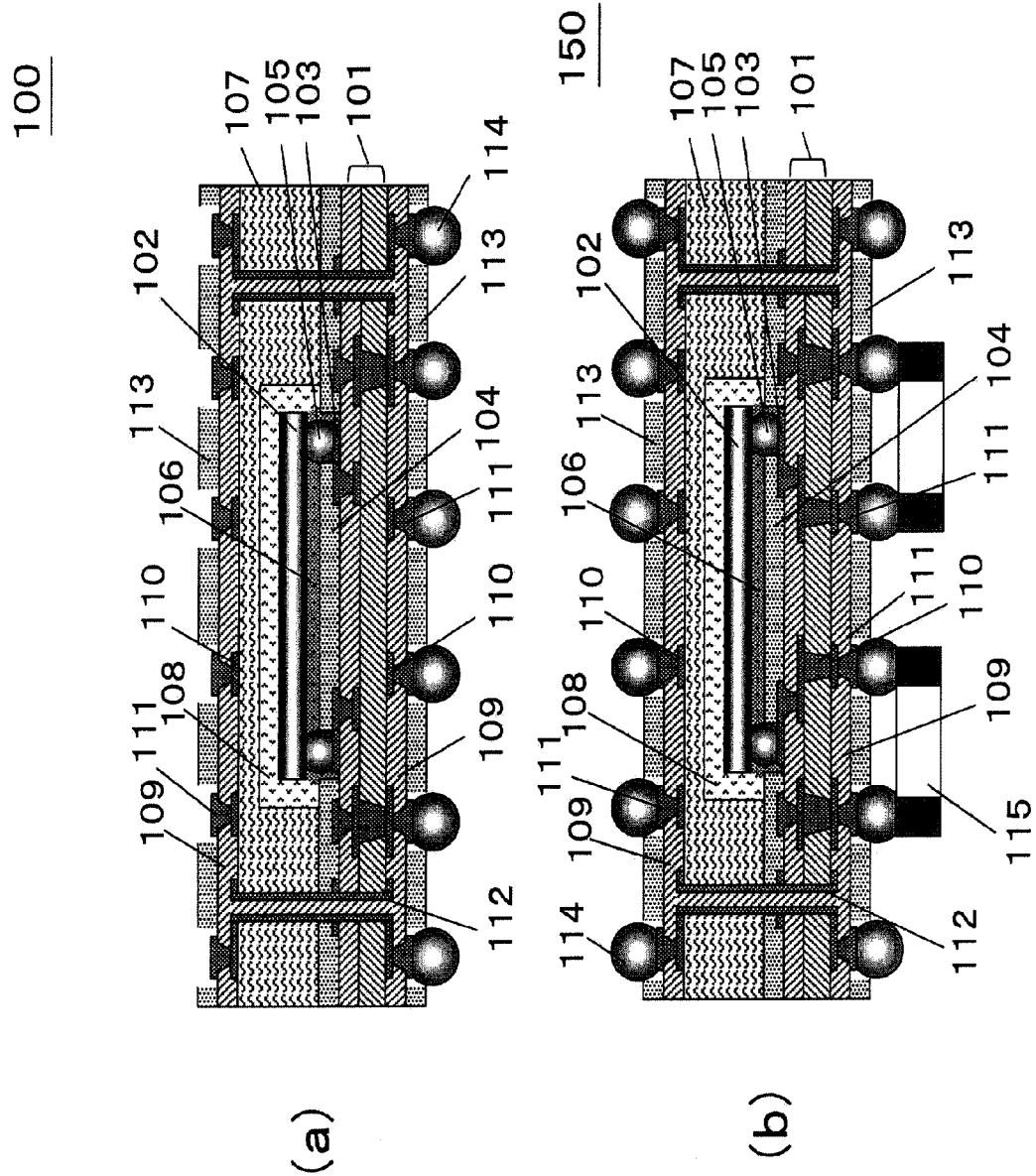
FIGS. 1(a) and 1(b) are schematic explanatory cross-sectional views showing a first embodiment of the printed wiring board with a built-in semiconductor element according to the present invention.

100, 150, 200, 600, 700, 800: printed wiring board with a built-in semiconductor element
101, 201, 306, 404, 601: base substrate
102, 202, 307, 405, 502, 602, 701: semiconductor element
103: mounting pad
104, 305, 403: protective film
105, 308, 406: solder
106, 204, 309, 407, 505: first insulating film
107: insulating layer
108, 205, 311, 410, 508: second insulating film
109: build-up layer
110, 302, 304, 313, 402, 412, 509, 512, 514: wiring circuit
111: interlayer connection via
112, 312, 411, 511: through hole
113, 316, 415, 515: solder resist
114, 317, 416, 516: solder ball
115: passive component
203, 603, 702: wire bonding
300, 400: double-sided copper-clad laminate
301, 401: blind hole
303: build-up base material
310, 314, 408, 413, 500, 506, 510, 513: semicured insulating sheet
315, 414: narrow-linewidth wiring circuit
409: double-sided substrate
311, 501, 507: copper foil
503: opening (for mounting a semiconductor element)
604, 703, 801: sealing material
605: wiring layer
606, 705: delamination
704: gap
802: irregularities

BEST MODE FOR CARRYING OUT THE INVENTION

A first embodiment of the printed wiring board with a built-in semiconductor element according to the present invention will be described with reference to FIGS. 1(a) and 1(b).

In FIG. 1(a), reference numeral 100 denotes the printed wiring board with a built-in semiconductor element, the structure of which will be described below.

A three-layer base substrate 101 is formed of a build-up substrate, and a protective film 104 is formed on the surface on which a semiconductor element 102 is mounted so as to protect the surface except mounting pads 103. The semiconductor element 102 is connected to the base substrate 101 through flip-chip bonding that uses solder 105. At least a first insulating film 106 is formed on the base substrate 101 side, that is, the underside of the semiconductor element 102, and on the connection terminal side of the base substrate 101 by filling a sealing material through underfill. An insulating layer 107 is formed in the side and upper portions of the semiconductor element 102 by laminating semicured insulating sheets. The gap around the semiconductor element 102 and the first insulating film 106 is filled with a second insulating film 108, which is the insulating resin melted by the heat generated in the lamination step.

In this embodiment, the presence of the first insulating film 106 formed by filling the sealing material through underfill on the underside of the semiconductor element 102 and the connection electrode side balances the linear expansion coefficient of silicon, which is the semiconductor element 102, with that of the organic substrate, thus preventing poor connection of the semiconductor element 102, for example, due to thermal history in backend production steps.

Since the gap around the semiconductor element 102 and the first insulating film 106 is filled with the second insulating film 108 formed of the insulating resin melted by the heat generated when the semicured insulating sheets 107 are laminated, this structure prevents cracking and improves adhesion to the insulating layers in the side and upper portions.

The first insulating film 106 contains a large amount of inorganic fillers and a small amount of resin in order to balance the linear expansion coefficient of silicon, which is the semiconductor element 102, with that of the organic substrate. Therefore, covering the semiconductor element 102 and the first insulating film 106 with the second insulating film 108 also solves the problem of poor adhesion to the insulating layers 107 in the side and upper portions.

Furthermore, build-up layers 109 are formed in overlying and underlying layers of the semiconductor element 102, allowing formation of wiring circuits 110 and interlayer connection vias 111. In the side portions, there are provided through holes 112 for connecting the build-up layers 109 above and below the semiconductor element 102. Although the through holes 112 are formed in this embodiment, interlayer connection vias may be formed across a plurality of layers to connect the front build-up layer to the rear build-up layer.

On the outermost layer, there are formed a solder resist 113 and solder balls 114 for connection to a mother board. It is noted that the solder balls 114 may be formed either on the front or rear side.

Furthermore, as shown in the printed wiring board 150 with a built-in semiconductor element in FIG. 1(b), passive components 115 may be mounted through solder in such a way that at least part of the passive components are located under the semiconductor element 102 described with reference to FIG. 1(a), that is, in the area immediately under the semiconductor element 102, and the solder balls 114 for connection to a mother board may be formed on the upper outermost layer above the semiconductor element 102. The passive components 115 may be connected to the semiconductor element 102 through the interlayer connection vias 111. The passive components herein may include capacitors, resistors, coils, and inductors of any form types, including chip-types. Any one of these components can be used, or two or more of these components can be combined for use, as appropriate.

Disposing the passive components under the semiconductor element 102 as described above reduces the wiring distance between the built-in semiconductor element 102 and the mounted passive components 115, reduces the connection impedance between the semiconductor element 102 and the passive components 115, and further improves effects of the passive components 115, such as those of removing noise from the power supply line and stabilizing the power supply voltage.

A second embodiment of the printed wiring board with a built-in semiconductor element according to the present invention will be described with reference to FIG. 2.

Figure 2:
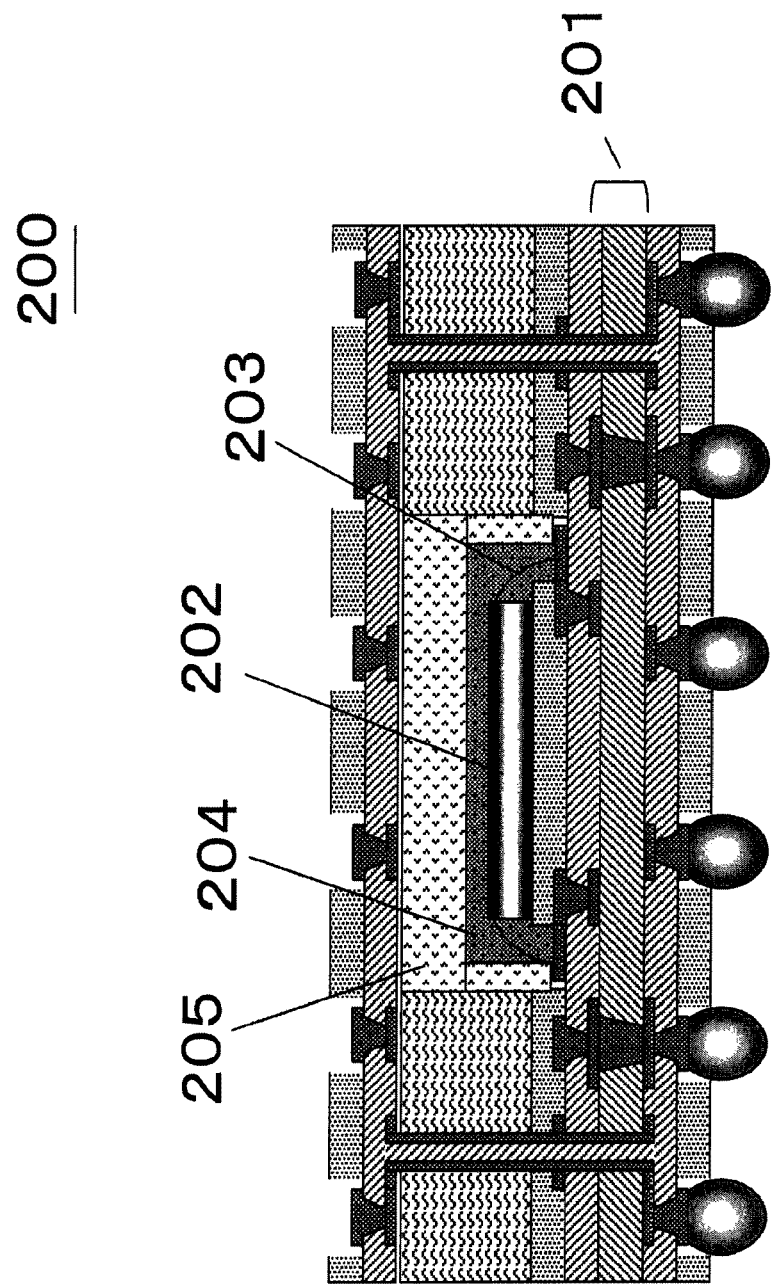
FIG. 2 is a schematic explanatory cross-sectional view showing a second embodiment of the printed wiring board with a built-in semiconductor element according to the present invention.

In FIG. 2, reference numeral 200 denotes the printed wiring board with a built-in semiconductor element, the structure of which will be described below.

The printed wiring board 200 with a built-in semiconductor element in the second embodiment is configured in the same way as the printed wiring board 100 with a built-in semiconductor element in the first embodiment except in that the upper and side portions of a built-in semiconductor element 202 are covered with a first insulating film 204 and the first insulating film 204 is further covered with a second insulating film 205 having a linear expansion coefficient different from that of the first insulating film 204.

The above difference results from the fact that the semiconductor element 202 is connected through wire bonding 203 instead of flip-chip connection.

A first embodiment of a process for producing the printed wiring board with a built-in semiconductor element according to the present invention will be described with reference to FIGS. 3(a) to 3(f) and 4(g) to 4(i).

Figure 3:
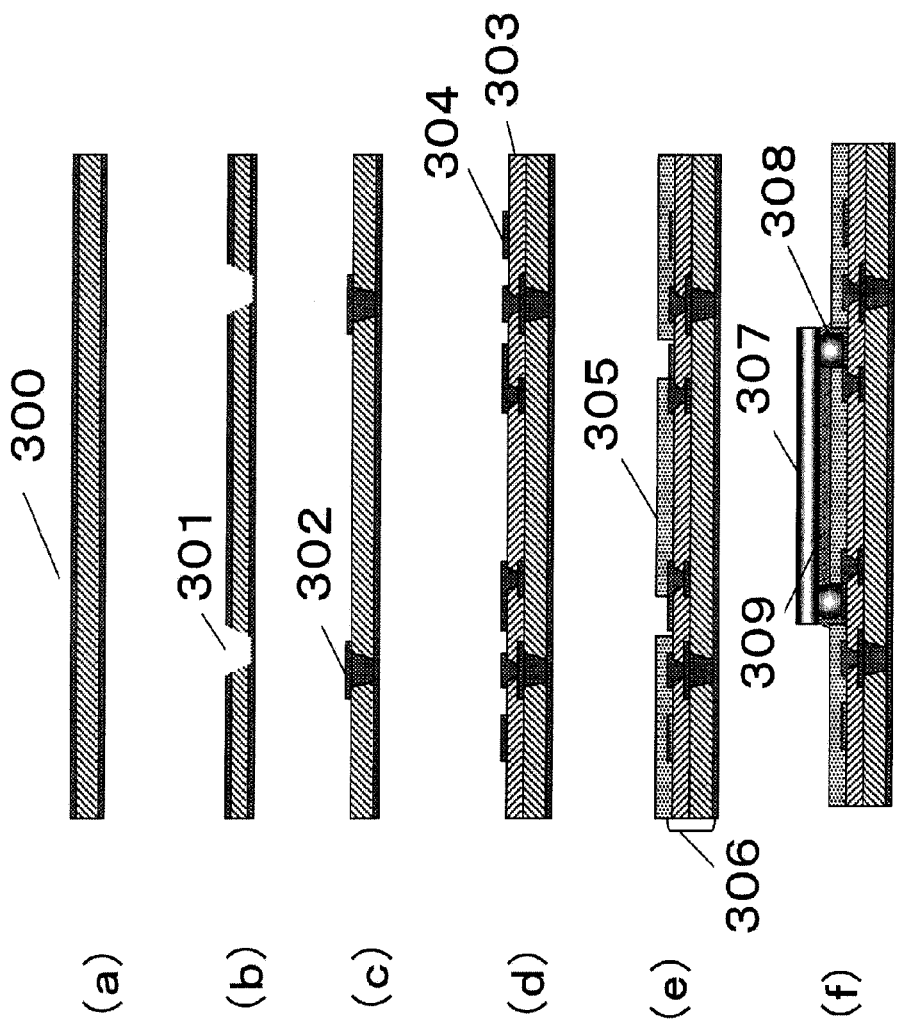
FIGS. 3(a) to 3(f) are schematic explanatory cross-sectional views showing a first embodiment of a process for producing the printed wiring board with a built-in semiconductor element according to the present invention.

First, a double-sided copper-clad laminate 300 is prepared as shown in FIG. 3(a), and blind holes 301 are formed through laser processing as shown in FIG. 3(b). Then, the entire surface including the blind holes 301 is plated with copper in an electroless/electrolytic copper plating process, and a wiring circuit 302 is formed only on one side in a photography process, as shown in FIG. 3(c). Next, as shown in FIG. 3(d), after a build-up base material 303 is stacked, blind holes are formed through laser processing and the entire surface undergoes electroless/electrolytic copper plating, a wiring circuit 304 is formed only on the stacked build-up base material surface in a photography process. Next, as shown in FIG. 3(e), a protective layer 305 is formed on the entire surface except the portions to be bonded to connection terminals of a semiconductor element. A base substrate 306 having a three-layer structure is thus provided. Although an aspect in which the base substrate having a three-layer structure is used is shown in this embodiment, the base substrate to be used is not limited thereto. For example, a double-sided printed wiring board or a multilayer printed wiring board having four or more layers may be used as the base substrate.

Then, as shown in FIG. 3(f), a semiconductor element 307 is connected through flip-chip mounting that uses solder 308. Next, a sealing material made of epoxy resin filled with inorganic fillers is used to seal the base substrate 306 side, that is, the underside and the connection terminals of the semiconductor element 307. A first insulating film 309 is thus formed. Alternatively, the semiconductor element 307 may be mounted through wire bonding.

Flip-chip connection may include Au solder bonding, solder bonding, Au/ultrasonic bonding, and Au/ACF bonding.

The first insulating film 309 that seals at least the underside and the connection terminals of the semiconductor element 307 serves to balance the linear expansion coefficient of the semiconductor element 307 with that of the organic substrate.

Figure 4:
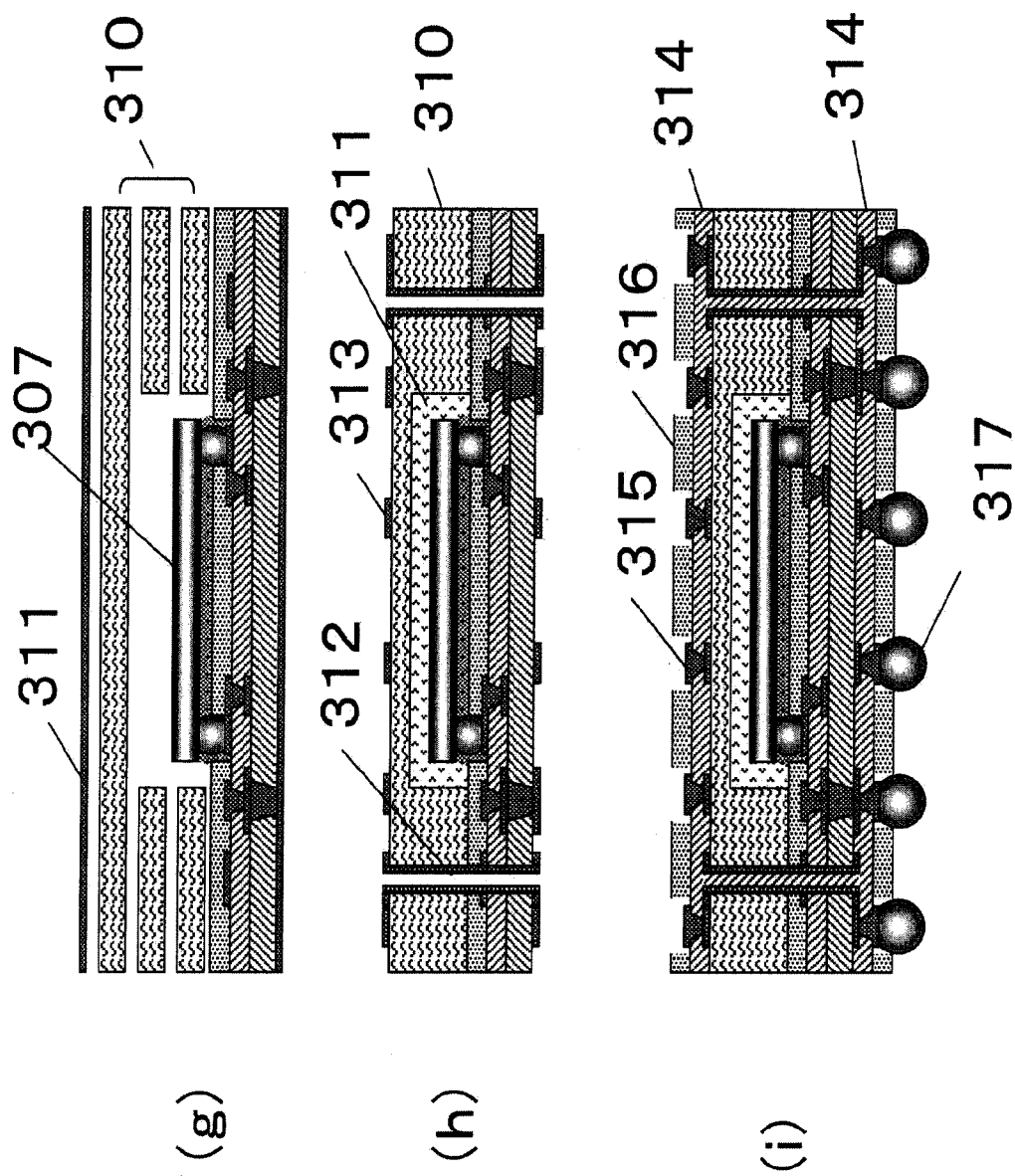
FIGS. 4(g) to 4(i) are schematic explanatory cross-sectional views of production steps following FIGS. 3(a) to 3(f)

Then, as shown in FIG. 4(g), a plurality of semicured insulating sheets 310, each having an opening corresponding to the mounted semiconductor element 307, and a semicured insulating sheet 310 without the opening are stacked, on which a copper foil 311 is further stacked and laminated.

The semicured insulating sheet 310 may be a prepreg formed of a glass cloth impregnated with epoxy resin or a build-up base material made of epoxy resin mixed with inorganic fillers, such as silica, as appropriate.

Then, as shown in FIG. 4(h), after the resin melted by the heat generated when the semicured insulating sheets 310 are laminated is cured to form a second insulating film 311, through holes are formed. After a desmear treatment, electroless/electrolytic copper plating is carried out to form plated through holes 312 for providing front-rear conduction. Wiring circuits 313 are then formed on both the front and rear sides in a photography process.

Then, as shown in FIG. 4(i), semicured insulating sheets 314 are stacked on the upper front and lower rear sides, and a semi-additive method is used to form outermost wiring circuits. That is, the following steps are carried out: first, a laser is used to form blind holes; electroless copper plating is precipitated on the entire surface; a plating resist is formed; only the portion where a wiring circuit is formed is exposed and developed; a narrow-linewidth wiring circuit 315 is formed in an electrolytic copper plating process; the plating resist is removed; the exposed electroless copper plating is removed, an outermost solder resist 316 is finally formed; and solder balls 317 are formed to mount a mother board. It is noted that the solder balls 317 may be formed either on the front side or the rear side. Furthermore, passive components (not shown) can be mounted under the semiconductor element 307 as described above.

A second embodiment of a process for producing the printed wiring board with a built-in semiconductor element according to the present invention will be described with reference to FIGS. 5(a) to 5(f), 6(g) and 6(h).

Figure 5:
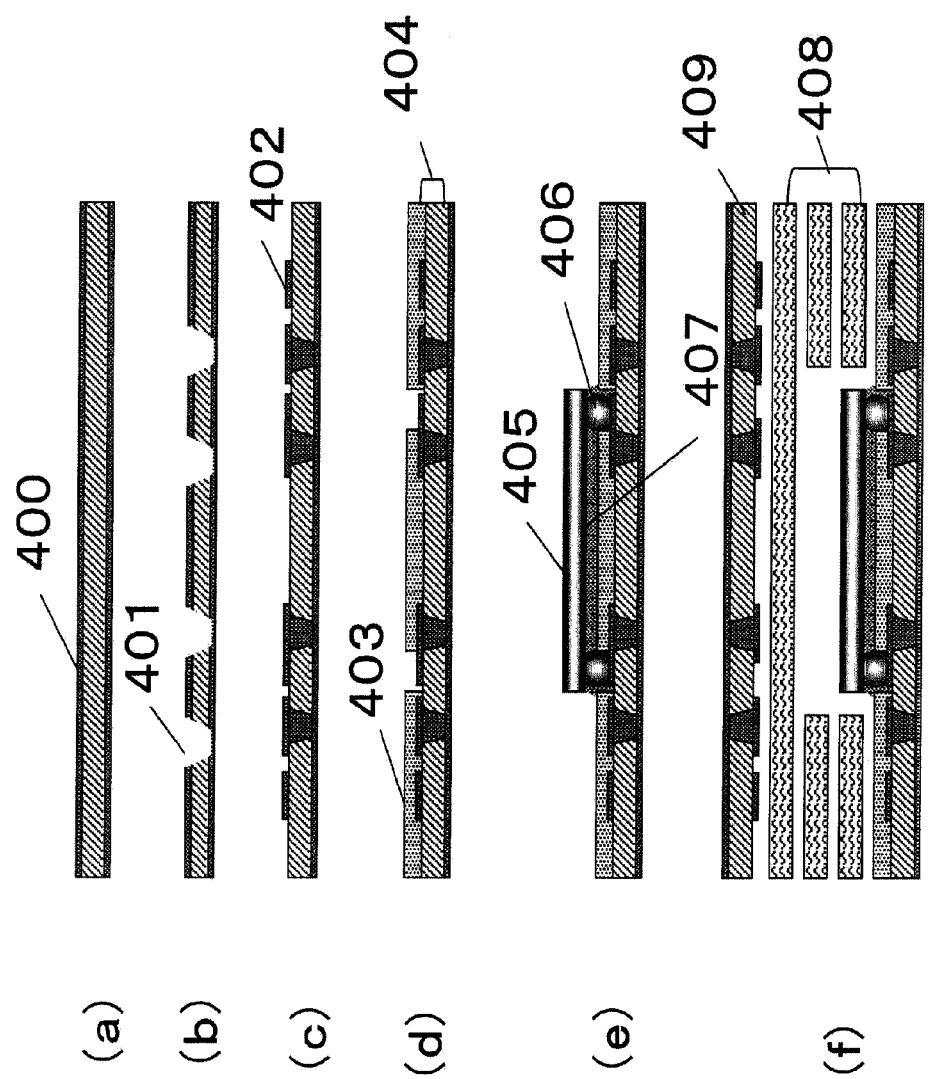
FIGS. 5(a) to 5(f) are schematic explanatory cross-sectional views showing a second embodiment of a process for producing the printed wiring board with a built-in semiconductor element according to the present invention.

First, a double-sided copper-clad laminate 400 is prepared as shown in FIG. 5(a), and blind holes 401 are formed through laser processing as shown in FIG. 5(b). Then, the entire surface including the blind holes 401 are plated with copper in an electroless/electrolytic copper plating process, and a wiring circuit 402 is formed only on one side in a photography process, as shown in FIG. 5(c). In this embodiment, two of such substrates, each having the wiring circuit 402, are produced. Then, as shown in FIG. 5(d), a protective layer 403 is formed on the entire surface of one of the substrates except the portions to be bonded to connection terminals of a semiconductor element. A base substrate 404 having a two-layer structure is thus provided. Although an aspect in which the base substrate having a two-layer structure is used is shown in this embodiment, the base substrate to be used is not limited thereto. For example, a multilayer printed wiring board having three, four or more layers may be used as the base substrate.

Then, as shown in FIG. 5(e), a semiconductor element 405 is connected through flip-chip mounting that uses solder 406. Next, a sealing material made of epoxy resin filled with inorganic fillers is used to seal the base substrate 404 side, that is, the underside and the connection terminals of the semiconductor element 405. A first insulating film 407 is thus formed. Alternatively, the semiconductor element may be mounted through wire bonding.

Flip-chip connection may include Au solder bonding, solder bonding, Au/ultrasonic bonding, and Au/ACF bonding.

The first insulating film 407 that seals at least the underside and the connection terminals of the semiconductor element 405 serves to balance the linear expansion coefficient of the semiconductor element 405 with that of the organic substrate.

Then, as shown in FIG. 5(f), a plurality of semicured insulating sheets 408, each having an opening corresponding to the mounted semiconductor element 405, and a semicured insulating sheet 408 without the opening are stacked. The double-sided substrate 409 with the wiring circuit 402 provided only on one side, which has been produced in FIG. 5(c), is further stacked and laminated with the side where the circuit has been formed stacked on the semicured insulating sheet side.

The semicured insulating sheet 408 may be a prepreg formed of a glass cloth impregnated with epoxy resin or a build-up base material made of epoxy resin mixed with inorganic fillers, such as silica, as appropriate.

Then, as shown in FIG. 6(g), after the resin melted by the heat generated when the semicured insulating sheets 408 are laminated is cured to form a second insulating film 410, through holes are formed. After a desmear treatment, electroless/electrolytic copper plating is carried out to form plated through holes 411 for providing front-rear conduction. Wiring circuits 412 are then formed on both the front and rear sides in a photography process.

Then, as shown in FIG. 6(h), semicured insulating sheets 413 are stacked on the upper front and lower rear sides, and a semi-additive method is used to form outermost wiring circuits. That is, the following steps are carried out: first, a laser is used to form blind holes; electroless copper plating is precipitated on the entire surface; a plating resist is formed; only the portion where a wiring circuit is formed is exposed and developed; a narrow-linewidth wiring circuit 414 is formed in an electrolytic copper plating process; the plating resist is removed; the exposed electroless copper plating is removed; an outermost solder resist 415 is finally formed; and solder balls 416 are formed to mount a mother board. It is noted that the solder balls 416 may be formed either on the front side or the rear side. Furthermore, passive components (not shown) can be mounted under of the semiconductor element 405 as described above.

A third embodiment of a process for producing the printed wiring board with a built-in semiconductor element according to the present invention will be described with reference to FIGS. 7(a) to 7(e), 8(f) and 8(g).

Figure 7:
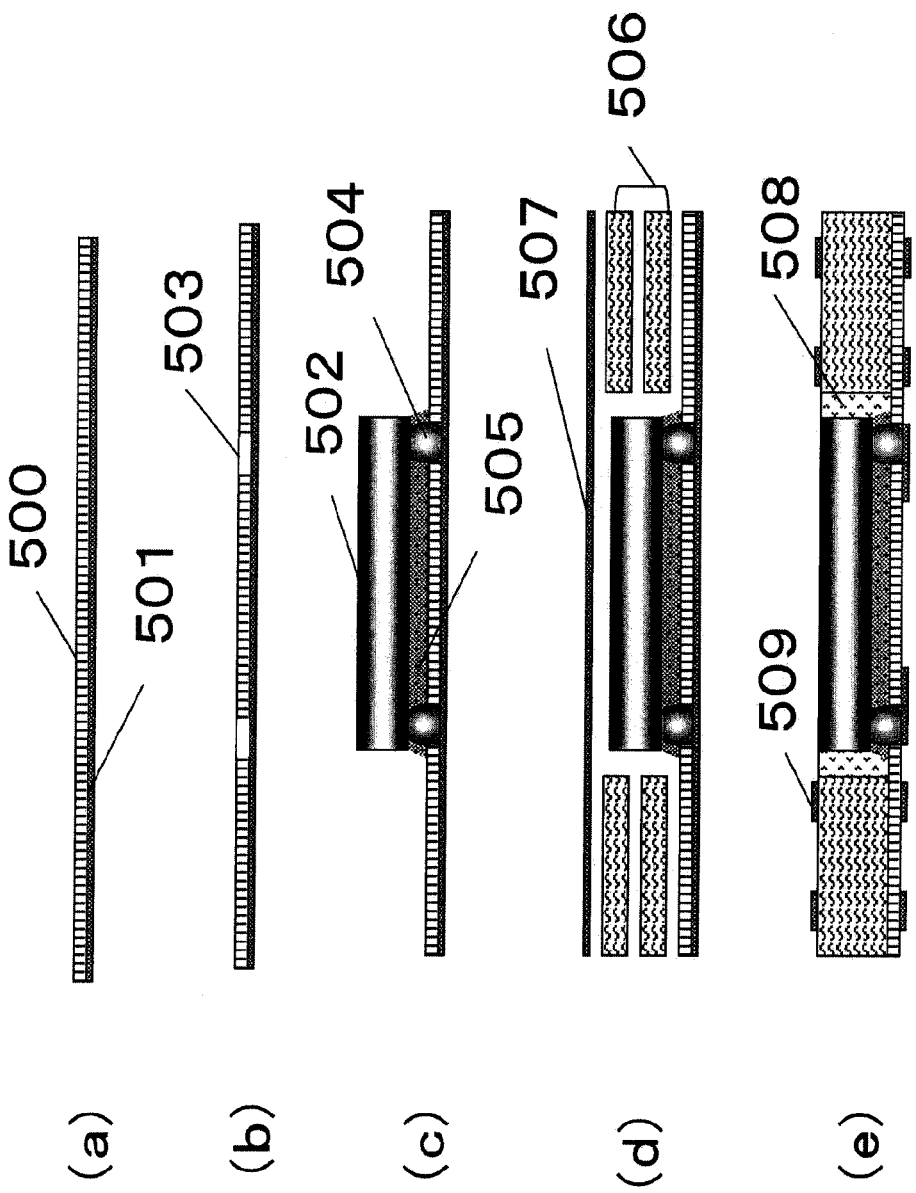
FIGS. 7(a) to 7(e) are schematic explanatory cross-sectional views of production steps showing a third embodiment of the printed wiring board with a built-in semiconductor element according to the present invention.

First, as shown in FIG. 7(a), a semicured thermosetting insulating sheet 500 is stacked and laminated on a copper foil 501. Then, as shown in FIG. 7(b), laser processing is used to form connection openings 503 for mounting a semiconductor element 502. The semicured thermosetting insulating sheet 500 in this embodiment, after cured, corresponds to the protective films 303 and 403 described in FIGS. 3(d) and 5(d), and a metal foil, such as a copper foil, is used as the base substrate.

The semicured thermosetting insulating sheet 500 may be a prepreg formed of a glass cloth impregnated with epoxy resin or a build-up base material made of thermosetting resin filled with inorganic fillers. Alternatively, a copper foil with resin, such as RCC, may be used.

Then, as shown in FIG. 7(c), a semiconductor element 502 is connected through flip-chip mounting that uses solder 504. Next, a sealing material made of epoxy resin filled with inorganic fillers is used to seal the base substrate side, that is, the underside and the connection terminals of the semiconductor element 502. A first insulating film 505 is thus formed. Alternatively, the semiconductor element may be mounted through wire bonding.

Flip-chip connection may include Au solder bonding, solder bonding, and Au/ultrasonic bonding.

The first insulating film 505 that seals at least the underside and the connection terminals of the semiconductor element 502 serves to balance the linear expansion coefficient of the semiconductor element with that of the organic substrate.

Then, as shown in FIG. 7(d), a plurality of semicured insulating sheets 506, each having an opening corresponding to the mounted semiconductor element 502, are stacked, on which a copper foil 507 is further stacked and laminated. As shown in FIG. 7(e), the heat generated in the lamination process melts the resin contained in the semicured insulating sheets 506 to form a second insulating film 508 that fills the gap between the side insulating layer and the semiconductor element. Wiring circuits 509 are formed on the front and rear sides in a photography process.

Figure 8:
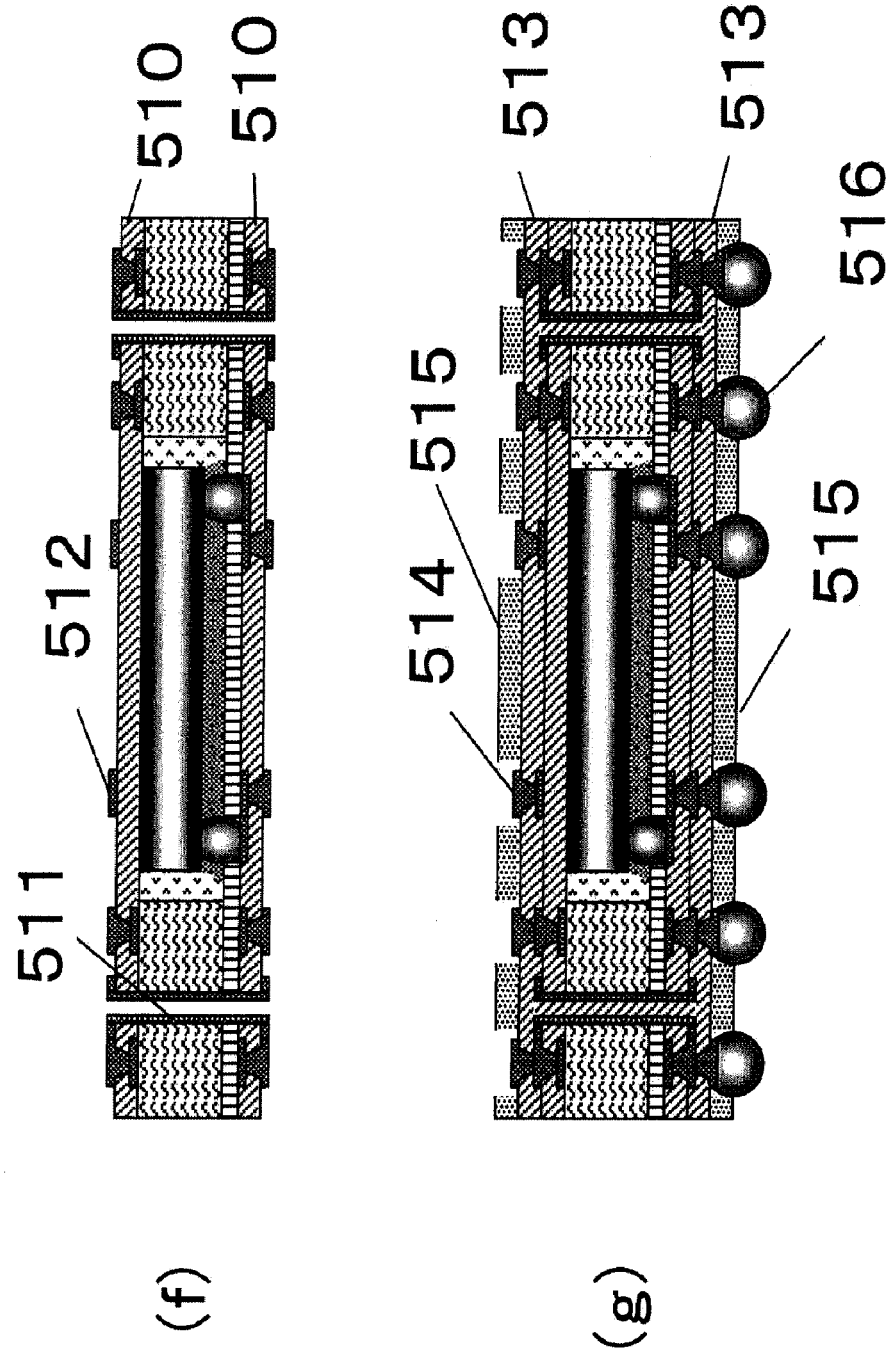
FIGS. 8(f) and 8(g) are schematic explanatory cross-sectional views of production steps following FIGS. 7(a) to 7(e)
Figure 9:
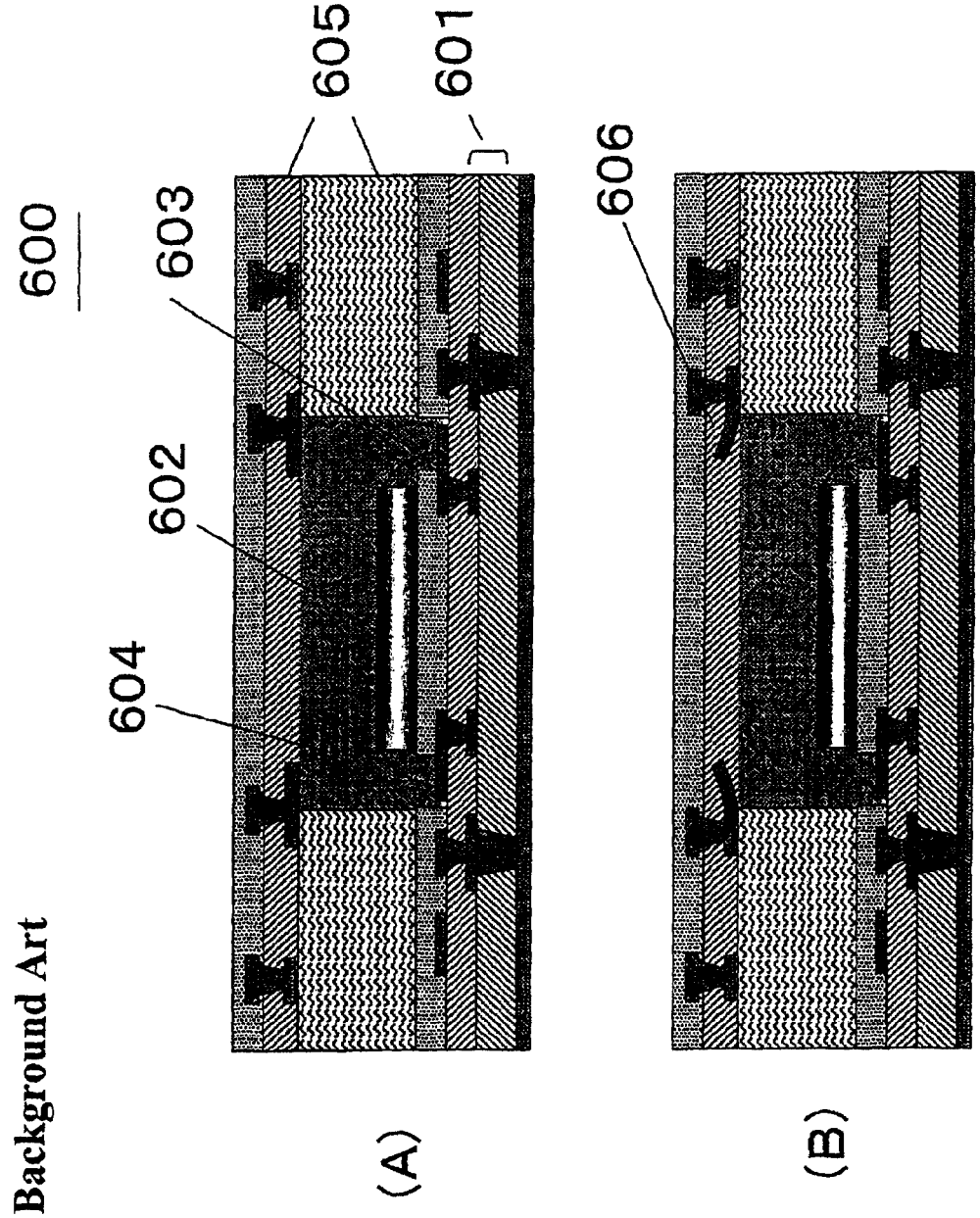
FIGS. 9(A) and 9(B) are schematic explanatory cross-sectional views showing a conventional printed wiring board with a built-in semiconductor element.
Figure 10:
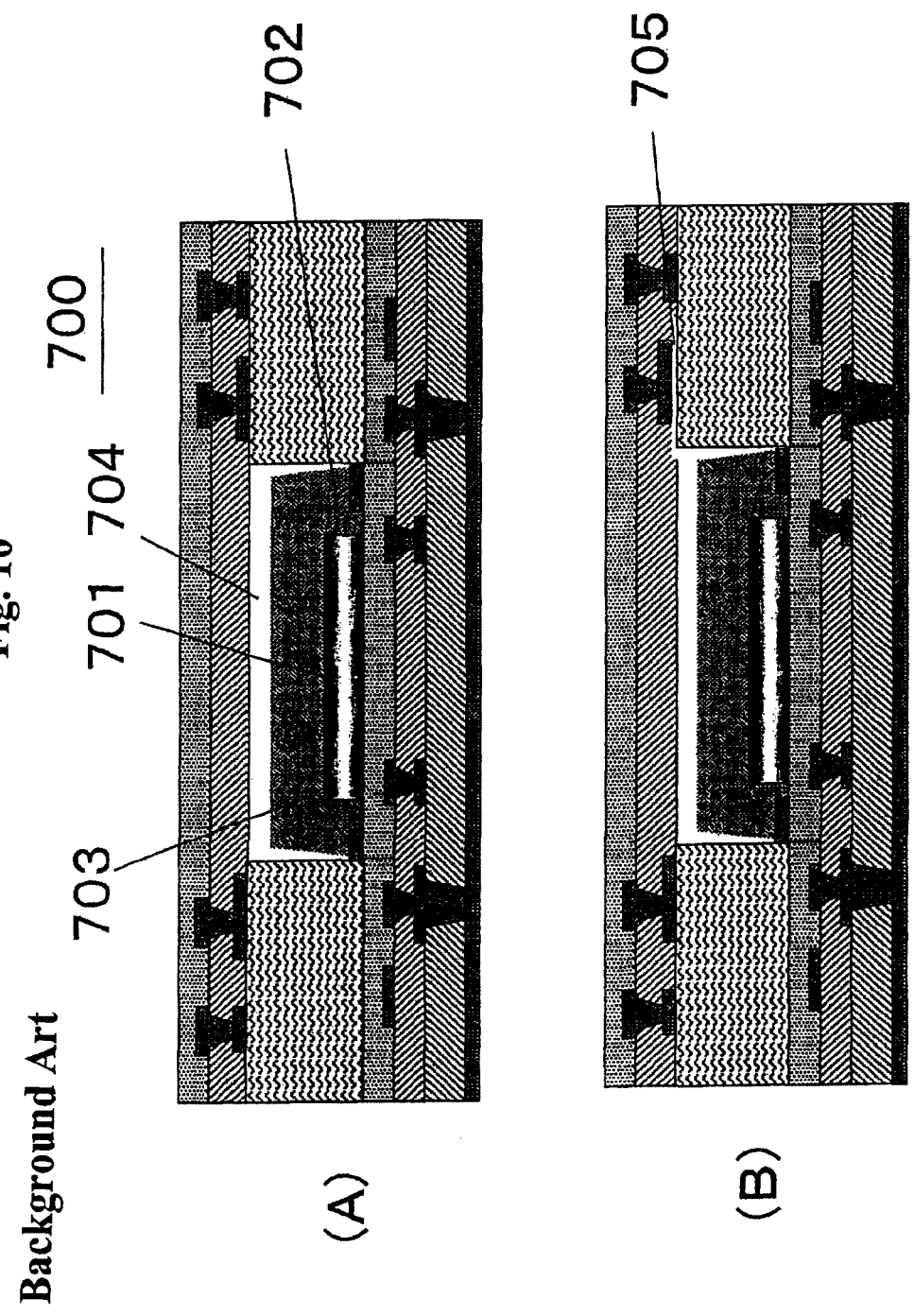
FIGS. 10(A) and 10(B) are schematic explanatory cross-sectional views showing another conventional printed wiring board with a built-in semiconductor element.

Then, as shown in FIG. 8(f), after semicured insulating sheets 510 are stacked on the upper and lower sides and through holes and blind holes are formed, the entire surface undergoes an electroless/electrolytic copper plating process to form plating through holes 511 for providing front-rear conduction. Wiring circuits 512 are then formed on the front and rear sides in a photography process.

Then, as shown in FIG. 8(g), the following steps are carried out: semicured insulating sheets 513 are stacked on the upper and lower sides; blind holes are formed; the entire surface undergoes an electroless/electrolytic copper plating process; outermost wiring circuits 514 are formed in a photography process; solder resists 515 are formed; and solder balls 516 are formed to mount on a mother board.

It is noted that the solder balls 114 may be formed either on the front side or the rear side.

Furthermore, passive components (not shown) can be mounted under the semiconductor element 502.

According to the present invention, it is possible to produce a printed wiring board with a built-in semiconductor element having a vertically symmetric structure, as the central part of which is the portion where the semiconductor element is built in. Furthermore, since the vertically symmetric structure is configured in such a way that the portion where the semiconductor element is built in is located in the central part of the structure, there is provided an advantage of reducing the risk that the printed wiring board is warped in the production steps.

The invention claimed is:

1. A printed wiring board, comprising:
   a built-in semiconductor element,
   a protective film formed on a semiconductor element-mounted surface of a base substrate to which the built-in semiconductor element is connected through wire bonding to protect the semiconductor element-mounted surface excepting a mounting pad,
   upper and side surfaces of the built-in semiconductor element covered with a first insulating film formed by filling a sealing material, and
   the first insulating film covered with a second insulating film formed of an insulating resin melted from an insulating layer that is provided in side and upper portions of the built-in semiconductor element.

2. The printed wiring board according to claim 1, wherein a side insulating layer is formed of a prepreg material or a build-up base material.

3. The printed wiring board according to claim 1, wherein an upper insulating layer is formed of a prepreg material or a build-up base material.

4. The printed wiring board according to claim 1, wherein a linear expansion coefficient of the first insulating film is different from that of the second insulating film.

5. The printed wiring board according to claim 1, wherein a passive component is disposed under the built-in semiconductor element.

6. The printed wiring board according to claim 5, wherein the passive component is connected to the built-in semiconductor element through an interlayer connection via.

7. The printed wiring board according to claim 5, wherein the passive component is any one of a resistor, a capacitor, a coil, and an inductor, or a combination of two or more thereof.

* * * * *

UNITED STATES PATENT AND TRADEMARK OFFICE
CERTIFICATE OF CORRECTION

| | | |
|---|---|---|
| PATENT NO. | : 8,035,979 B2 | Page 1 of 1 |
| APPLICATION NO. | : 12/966251 | |
| DATED | : October 11, 2011 | |
| INVENTOR(S) | : Yutaka Yoshino et al. | |

It is certified that error appears in the above-identified patent and that said Letters Patent is hereby corrected as shown below:

On the title page, Item (62), the Related U.S. Application Data information is incorrect. Item (62) should read:

-- Related U.S. Application Data

(62) Division of application No. 11/913,559, filed as application No. PCT/JP2006/323699 on Nov. 28, 2006, now Pat. No. 7,894,200. --

Signed and Sealed this
Twenty-second Day of November, 2011

David J. Kappos
*Director of the United States Patent and Trademark Office*